United States Patent
Gilman

(10) Patent No.: US 8,291,853 B2
(45) Date of Patent: Oct. 23, 2012

(54) APPARATUS FOR FORMING A FLEXIBLE NANOSTRUCTURED MATERIAL FOR PHOTOVOLTAIC PANELS

(76) Inventor: Boris Gilman, Mountain View, CA (US)

( * ) Notice: Subject to any disclaimer, the term of this patent is extended or adjusted under 35 U.S.C. 154(b) by 619 days.

(21) Appl. No.: 12/589,711

(22) Filed: Oct. 27, 2009

(65) Prior Publication Data
US 2010/0288196 A1 Nov. 18, 2010

Related U.S. Application Data

(60) Provisional application No. 61/216,400, filed on May 18, 2009.

(51) Int. Cl.
*B05C 7/00* (2006.01)
*C23C 16/00* (2006.01)
(52) U.S. Cl. ........................ 118/308; 118/726
(58) Field of Classification Search .................. None
See application file for complete search history.

(56) References Cited

U.S. PATENT DOCUMENTS

| | | | |
|---|---|---|---|
| 4,440,350 A * | 4/1984 | Dietz et al. ............ | 239/703 |
| 4,613,076 A * | 9/1986 | Dietz et al. ............ | 239/3 |
| 6,696,107 B2 | 2/1994 | Eastham | |
| 5,770,126 A | 6/1998 | Singh et al. | |
| 6,368,406 B1 | 4/2002 | Deevi et al. | |
| 7,585,751 B2 | 9/2009 | Kirihara | |
| 2005/0133087 A1 | 6/2005 | Alivisatos et al. | |
| 2006/0093749 A1 | 5/2006 | Kim et al. | |
| 2006/0110544 A1* | 5/2006 | Kim et al. ............ | 427/458 |
| 2008/0108122 A1 | 5/2008 | Paul et al. | |
| 2008/0142075 A1 | 6/2008 | Reddy et al. | |
| 2008/0274282 A1 | 11/2008 | Bent et al. | |
| 2009/0017217 A1* | 1/2009 | Hass et al. ............ | 427/446 |

OTHER PUBLICATIONS

"Efficient solution-processed infrared photovoltaic cells", *Applied Physics letters*, 90, 183113, (2007).
"Advanced inorganic materials for photovoltaics", *MRS Bulletin*, 32, 211-214, (2007).
"The photoconversion mechanism of excitonic solar cells", *MRS Bulletin*, 30, 20-22, (2005).
"Solar cells based on quantum dots: multiple exciton generation and intermediate bands", *MRS Bulletin*, 32, 236-240, (2007).
"Air-stable all-inorganic nanocrystal solar cells processed from solution", Science, 310, 462-465, (2005).
"Nanostructured Organic-inorganic Hybrid Solar Cells", MRS Bulletin, 34, 95-100, (2009).
"Aerosol Technology" by W.C.Hinds, John Wiley & Sons, 1999, 48-50.

* cited by examiner

*Primary Examiner* — Dah-Wei Yuan
*Assistant Examiner* — Charles Capozzi

(57) ABSTRACT

Provided is an apparatus for manufacturing a composite material consisting of a flexible substrate and a multilayer nanostructured PV-active film supported by the substrate. The apparatus comprises a sealable chamber, the cylindrical inner wall of which is used as a support for a flexible substrate. The chamber contains a rotating crucible having a recess in its center and flat margins. The apparatus is provided with a power laser capable of generating an annular beam focused on the aforementioned flat surface. In operation, a nanoparticle-containing colloidal solution is supplied to the crucible. During rotation, the solution moves to the flat margins where it forms a thin layer that is evaporated by means of the annular laser beam. As the solution evaporates, the nanoparticles, which remain on the surface, fly out by inertia from the edges of the crucible to the flexible substrate. The deposition process can be controlled so that the deposited layers form a PV-active film.

18 Claims, 6 Drawing Sheets

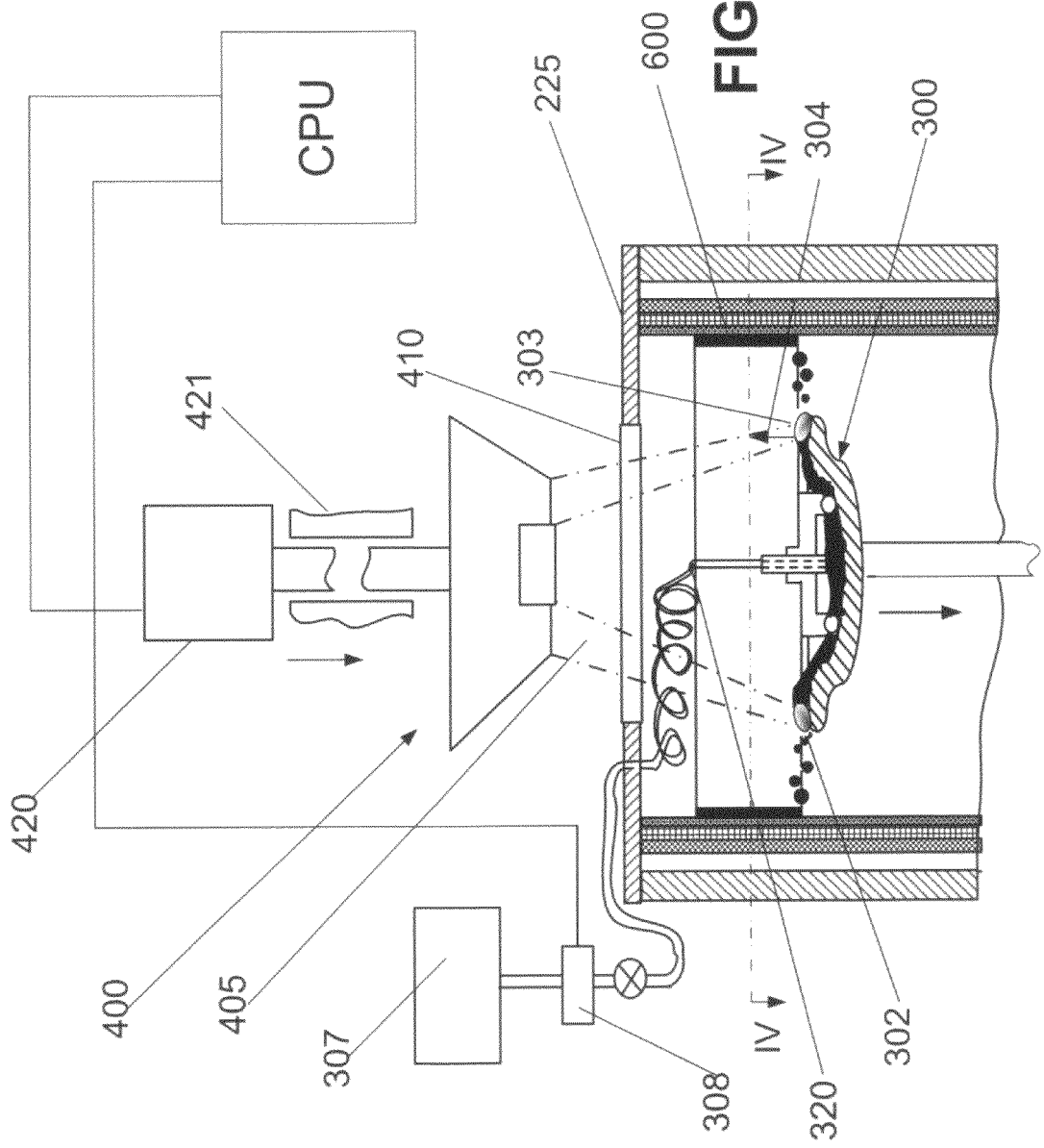

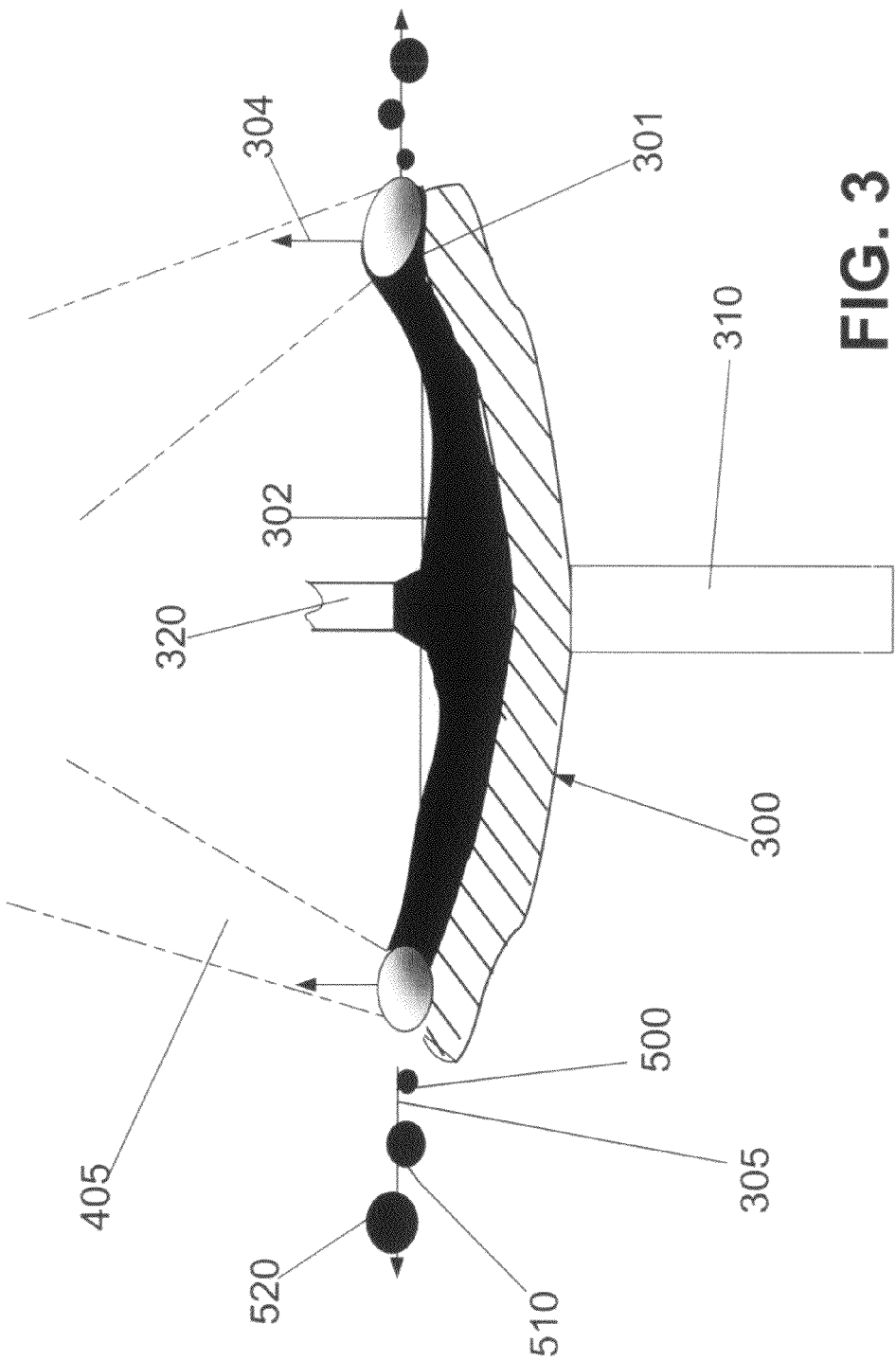

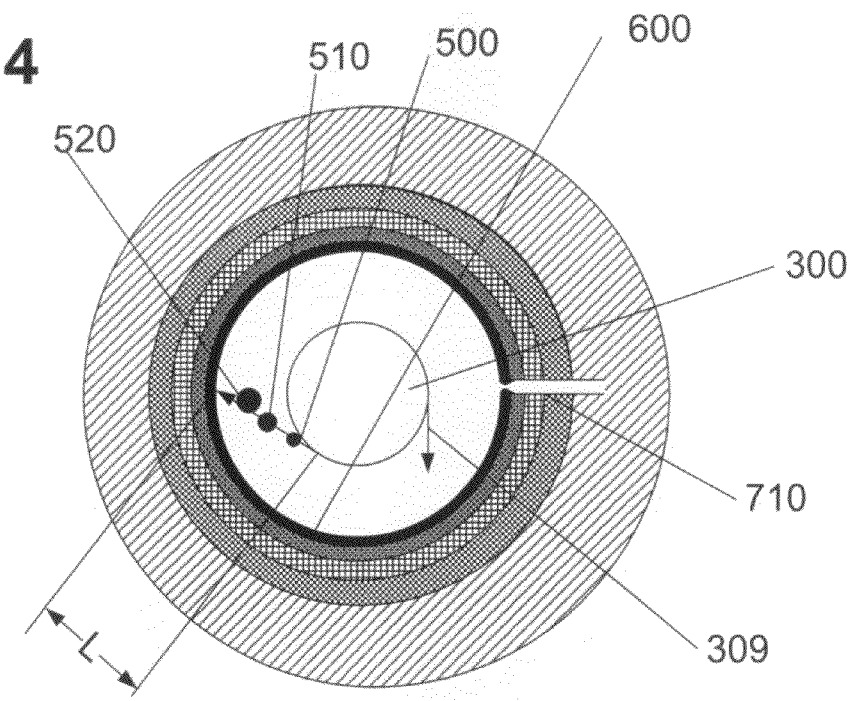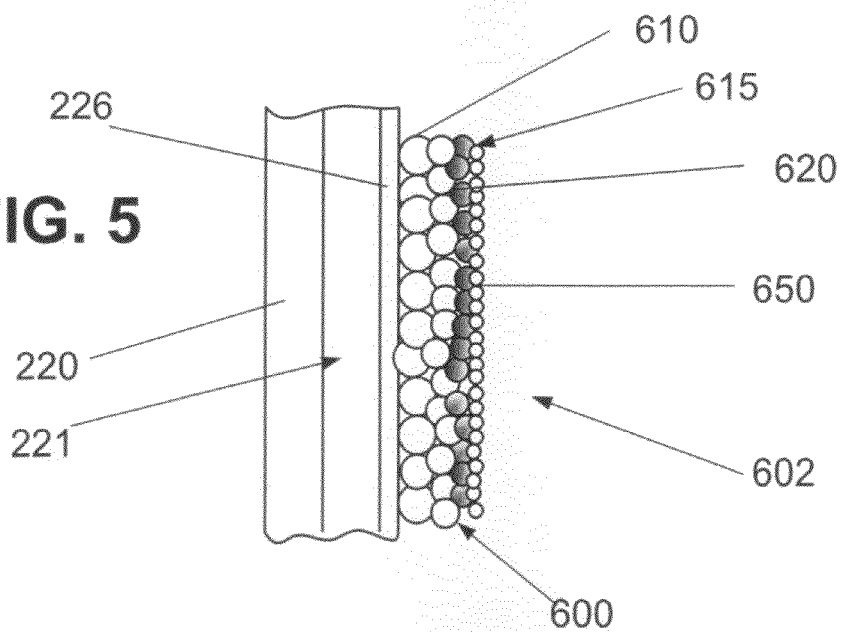

L=2cm

L=10cm

APPARATUS FOR FORMING A FLEXIBLE NANOSTRUCTURED MATERIAL FOR PHOTOVOLTAIC PANELS

CROSS-REFERENCE TO RELATED APPLICATIONS

This application claims priority from U.S. Provisional Patent application Ser. No. 61/216,400 filed on May 18, 2009 titled "Method and apparatus for depositing nanoparticle layers in pre-defined order of their size and/or type of material (multilayer nanostructured films)" and is incorporated herein in its entirety.

FIELD OF THE INVENTION

The present invention generally relates to flexible nanostructured materials, in particular to highly efficient and low-cost flexible materials for photovoltaic (PV) and optoelectronic (OE) applications. More specifically, the invention relates to an apparatus for manufacturing a composite material consisting of a flexible substrate and a multilayer nanostructured PV-active film supported by the substrate. The apparatus is applicable for forming high-efficient and low-cost PV solar panels of large surface areas.

BACKGROUND OF THE INVENTION

Nanoparticles of various semiconductors can be synthesized by means of a well known colloidal organic process (see "Efficient solution-processed infrared photovoltaic cells," *Applied Physics Letters*, 90,183113) by deposition from a gas phase or by sputtering. The typical size of a nanoparticle (required for band gap tuning and quantum confinement) ranges from 2 to 8 nm. Nanoparticles may have different shapes, such as quantum dots, wires, rods, crystals, etc. Nanoparticles suitable for photovoltaic (PV) application are exemplified by Si, Ge, CdTe, CdSe, CdS, InP, TiOx, InAs, PbS, PbSe, HgTe, $CuInSe_2$, $CuInGaSe_2$, etc. (see "Advanced inorganic materials for photovoltaics," *MRS Bulletin*, Vol. 32, pp. 211 to 214).

Typically, in manufacture of a PV device, a nanoparticle-containing solution is deposited onto a precoated transparent substrate (e.g., glass) and consequently converted into a very thin film (30 to 200 nm) of a selected type by the spin-casting procedure. Nanoparticles can be also embedded in some photoactive organic films (e.g., polymers) to form a "hybrid" hetero-junction PV device or a bilayer structure to form a bulk hetero junction (see "Semiconductor-nanocrystal/conjugated polymer thin films," U.S. Patent Application Publication, US2005/0133087 (inventor Alivisatos, A. Paul, et al) which discloses manufacture of thin films comprising inorganic semiconductor nanocrystals dispersed in semiconducting polymers in high loading amounts).

In addition to the potential simplicity and low processing cost of nanoparticle-based films, such films possess some unique material properties highly desirable for PV applications. Such properties relate to better ability of nanoparticles to use the incoming radiation energy, particularly in the IR portion of the spectrum, as compared with bulk and TF counterparts. The aforementioned properties contribute to the mentioned capability of nanoparticle-based materials (for further explanation see "The photoconversion mechanism of excitonic solar cells," *MRS Bulletin*, Vol. 30, pp. 20 to 22 and "Solar cells based on quantum dots: multiple exciton generation and intermediate bands," *MRS Bulletin*, Vol. 32, pp. 236 to 240).

It should be noted that nanoparticle "patterning" mentioned in some references, such as U.S. Pat. No. 6,696,107 issued in 1994 to Derek A. Eastman and U.S. Patent Application Publication US2006/093749, typically relates to device layout formation along the active surface of a device (i.e., horizontal patterning) rather than cross-section patterning across active nanoparticle layers (i.e., vertical patterning). Other types of nanoparticle-based films can be formed in the complimentary layer that has a junction interface with the first layer, e.g., as in the reference "Air-stable all-inorganic nanocrystal solar cells processed from solution," *Science*, Vol. 310, pp. 462 to 465. Although the size of a nanoparticle in some of the aforementioned film can be well controlled (see Patent Application Publication US2008/274282 (inventors: Stacey Bent, et al.)). All aforementioned methods of depositing nanoparticle-based layers are incapable of providing nanoparticle-structured films that consist of nanoparticle layers positioned in a predefined order of size or type of material. The aforementioned methods do not provide for proper control of nanoparticle layer structure across film with regard to type of material or size.

In other words, known methods of forming nanocomposite films by depositing and processing nanoparticle-based layers are fundamentally limited in producing predefined nanoparticle spatial arrangements of size or type of material. Consequently, PV devices made of such nanocomposite films typically exhibit low carrier transport and collection efficiency (i.e., internal quantum efficiency), incomplete spectral coverage, limited Voc, etc. Some advanced nanocomposite structures for PV applications are described in "Nanostructured Organic-inorganic Hybrid Solar Cells," *MRS Bulletin*, Vol. 34, pp. 95 to 100. It should be noted, however, that none of the proposed structures present a nanostructured film that comprises a sequence of nanoparticle layers arranged in the order of their size or type of material.

U.S. Patent Application Publication 20080142075A1 published in 2008 (inventor D. Reddy, et al) describes nanoparticle-based films and related PV devices that may have nanoparticle layers formed on a substrate in order of nanoparticle size (nanostructured film). Certain PV devices, such as solar cells, are described as using nanoparticle-based film of the aforementioned type as one of the PV-active layers. According to the aforementioned invention, such a PV-device will have an electropotential gradient (i.e., an electric field) that results from a nanoparticle size gradient and a related shift in energy band, thus significantly improving the drift component of photo-generated carriers. That, in turn, will result in enhanced carrier transport and collection efficiency (i.e., internal quantum efficiency) of the device. Also, based on the photo-conversion mechanism in nanoparticle-based materials as described in "The photoconversion mechanism of excitonic solar cells," *MRS Bulletin*, Vol. 30, pp. 20 to 22, PV devices made of such materials are expected to provide higher Voc.

U.S. Patent Application Publication 20080108122 published in 2008 (inventor B. K. Paul, et al) discloses embodiments of microchemical nanofactories that could be used to fabricate a variety of tailored gradient structures from nano-, micro-, and macroscale particles in which the particles are arranged in sequential layers and vary is size or density, or both.

However, known methods for forming sequential layers of PV nanostructures with gradual variation in nanoparticle size or type of material in the direction away from the substrate requires highly complex and lengthy deposition and control processes, which is not a cost-effective solution. Furthermore, it is possible that application of any layer may partially or entirely damage the preceding nanoparticle layer and that the suggested methods will not be justifiable for coating surfaces of large areas.

Also known in the art are methods for forming intermetallic nanoparticles by evaporating a liquid component of a nanoparticle-containing solution, which is achieved, e.g., by irradiating such a solution with a high-energy beam.

U.S. Pat. No. 6,368,406 issued in 2002 to S. Deevi, et al, discloses a method of forming intermetallic nanoparticles by subjecting a starting material to laser energy so as to form a vapor and condensing the vapor so as to form intermetallic nanoparticles. The starting material can be a mixture of pure elements or an alloy of two or more elements. The nanoparticles can be provided with a narrow size distribution, with an average particle size of 2 to 100 nm, preferably 2 to 9 nm. The nanoparticles can be formed in a vacuum chamber wherein a temperature gradient is provided. The atmosphere in the chamber can be an inert atmosphere, such as argon, or a reactive atmosphere, such as isobutene or oxygen. An electric field can be used to form filaments of the nanoparticles.

U.S. Pat. No. 5,770,126 issued in 1998 to J. Singh, et al, discloses a process and apparatus for producing nanoscale particles using the interaction between a laser beam and a liquid precursor solution. According to one embodiment, a solid substrate is used during laser-liquid interaction. The laser beam is directed at the solid substrate, which is immersed in the liquid precursor solution, and rotates.

SUMMARY OF THE INVENTION

The present invention provides a novel and efficient apparatus for depositing multilayer nanostructured films on a substrate to ensure a predefined sequence of nanoparticle layers, each layer having nanoparticles of the same size or type of material, or both, in order of size of nanoparticles in the layers throughout the film.

According to one or several aspects of the invention, the proposed apparatus for depositing a multilayer nanostructured film also provides a predefined sequence of layers in accordance with the size and density of nanoparticles in the layer.

Nanoparticles are assumed to have a round shape of a given radius (quantum dots); the density of a nanoparticle is defined by the type of material nanoparticle is made of (e.g., InAs, CdSe, etc.). The apparatus of this invention provides depositing multilayer nanostructured films on various types of substrates, preferably on flexible substrates of a large area preferably precoated with conductive and barrier layers.

According to one aspect of the invention, the multilayer nanostructured film can be deposited in a form of an all-inorganic (i.e., consisting of nanoparticles only) structure on the surface of a substrate or, according to another aspect of the invention, in the form of nanoparticle layers embedded into a polymer-based film which is laid onto the substrate surface. In both cases, the aforementioned bulk heterojunction structure is achieved in the deposited film, thus making it possible to ensure PV-energy conversion. The apparatus of the invention can be used to form a novel type of flexible nanostructured material suitable for highly efficient and low-cost PV applications, as well as for optoelectronic, microelectronic, and other applications.

The method realized by the apparatus of the invention is based on the principles of nanoparticle motion (flight) through a gaseous medium. Hereinafter this process of flying particles is referred to as "FP process" and the term "flying particles" is abbreviated "FP." The concept and the physical model of the FP process are described below. The essence of the method is to create conditions for nanoparticles of a different size and/or type of material to fly from a properly prepared nanoparticle-containing solution toward a preplaced flexible substrate and through the selected gaseous medium, thus experiencing ambient resistance forces. The nanoparticle-containing solution has a predefined mix of nanoparticles of different sizes and/or type of material. According to the mechanical laws of motion (i.e., Newton's and Stokes' laws), resistance force experienced by a given nanoparticle moving through a gaseous medium depends on the medium resistance (dynamic viscosity) and on the velocity, size and density of the nanoparticle.

According to one aspect of the invention, equal initial velocity is provided for all nanoparticles contained in the solution. In this case, for a given gas of a given pressure the resistance force experienced by an FP depends on its instantaneous velocity, size, and density (i.e., type of material). It should be noted that FP motion through the gaseous medium is considered to be identical to the motion of a regular solid mass through the same medium and consequently following the same mechanical laws. This assumption is correct for any FP that has a momentum value much greater than an average momentum value for the gas molecules at a given temperature and pressure. Such conditions are satisfied for a wide range of FP mass and velocities. Analysis of forces and accelerations acting on an FP (described in more detail in the following sections) shows that, according to Newton's and Stokes' Laws, FP acceleration is a direct function of FP size and/or density (type of material) so that FPs of various sizes and/or types of material receive different accelerations during their flight to a substrate. This results in a different time-to-target ("arrival time") for FPs of different sizes and/or type of material and consequent formation of nanoparticle layers in order of increasing or decreasing size or alternating composition. By selecting a nanoparticle mixture of predefined sizes and type of material in the initial nanoparticle-containing solution, the proposed method will create a sequence of nanoparticle layers with well controlled thickness of each layer following each other in order of size and/or type of material throughout the film, thus forming a desired multilayer nanostructured film.

According to one aspect of the present invention, the FP process described above is realized in an apparatus that comprises the following: (1) sealable cylindrical chamber filled with gas of a required pressure; (2) initial flexible substrate made of an insulating film and precoated with a proper conductive coating (e.g., in the form of a metal conductive film with a carrier-blocking layer on top of the film that covers the inner wall of the chamber; (3) colloidal nanoparticle-containing solution supplied to the recess of a rotating body, such as a rotating crucible located in the interior of the chamber; (4) means for driving the aforementioned crucible into rotation and means for moving the aforementioned crucible in the vertical direction of the chamber; (5) power laser capable of interaction with the contents of the crucible by irradiating a predetermined part of the crucible surface; (6) other auxiliary components of the chamber required for the process, such as the source of vacuum, the source of the colloidal solution supply, the source of electric supply, etc.

The nanoparticle-containing solution comprises a predefined mixture of nanoparticles of different size and/or compositions dissolved, e.g., in a solution. Conditions are created in the deposition process for a nanoparticle-containing solution to rotate together with the crucible and partially evaporate during the deposition process under the effect of laser irradiation. While the solution evaporates, the nanoparticles remain intact and fly out of the solution in the tangential direction of the rotating crucible. As mentioned above, each FP experiences a resistance force that depends on the size and density (i.e., type of material) of the particle. Therefore, the time-to-target will be differentiated for different particles and will provide different positions of the particles on the substrate, thus forming a multilayer nanostructured film with layers arranged in sequence and corresponding to nanoparticle size and/or composition.

If the nanoparticles are made, e.g., from Si, Ge, CdTe, CdSe, CdS, InP, TiOx, InAs, PbS, PbSe, HgTe, $CuInSe_2$, $CuInGaSe_2$, etc., and if the substrate coating is made from an electron-collecting thin metal film combined with hole-blocking layers such as $C_{60}$, then the obtained flexible nanostructured material is suitable for use as a high-efficient low-cost solar panel.

BRIEF DESCRIPTION OF THE DRAWINGS

FIG. 2 is a partial view of the apparatus in FIG. 1, showing the apparatus in action.

FIG. 3 is a view that details the essential parts of the apparatus of FIGS. 1 and 2 on a larger scale.

FIG. 4 is a sectional view along line IV-IV of FIG. 2, some details being omitted for simplicity of explanation.

FIG. 5 is a sectional view that shows the structure of the flexible nanostructured material of the invention during its formation.

DETAILED DESCRIPTION OF THE INVENTION

Figure 1:
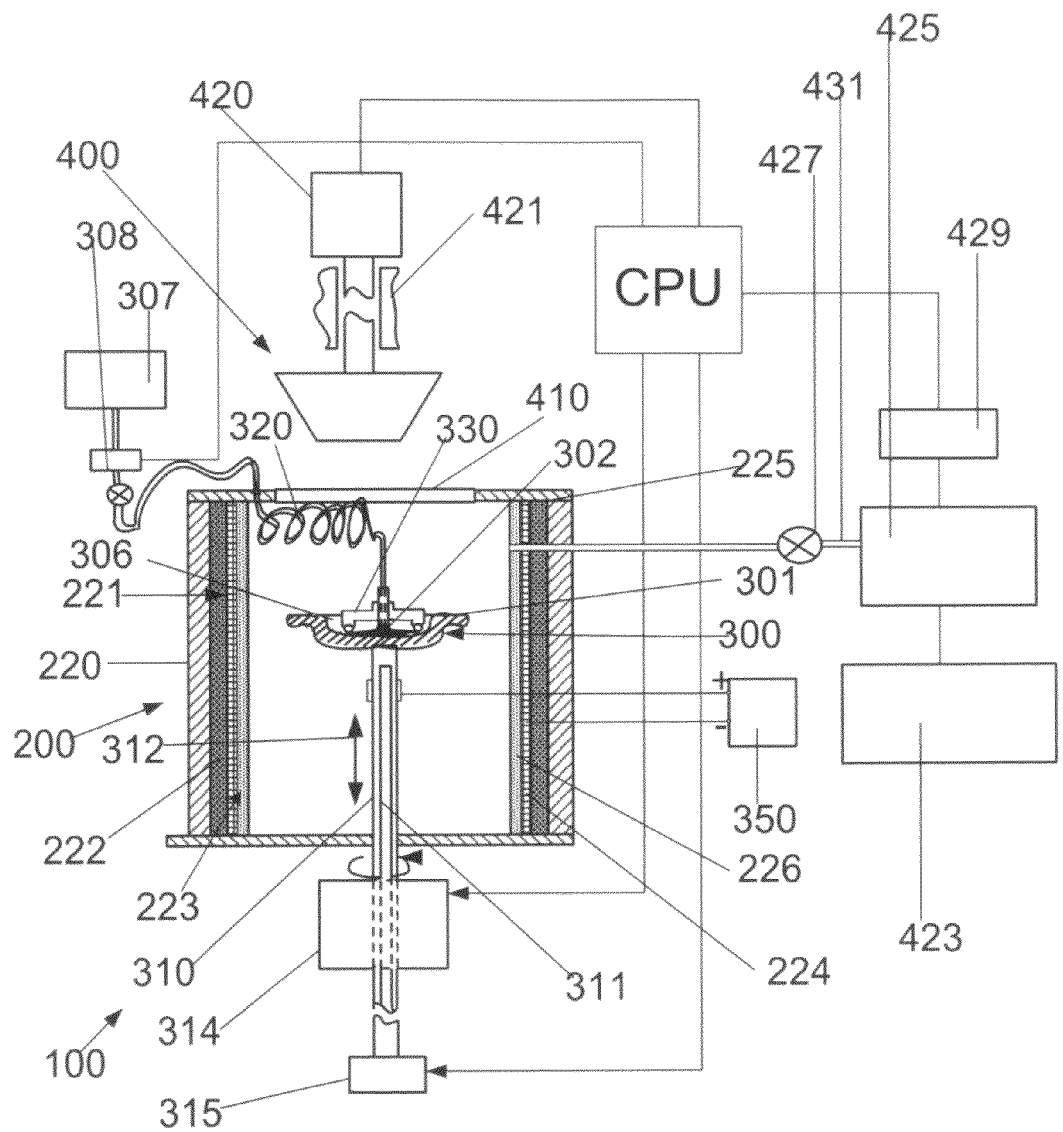
FIG. 1 is a schematic elevation sectional view of the apparatus of the invention, the components being shown in static.

In the context of the present invention, the term "flexible nanostructured material" means the combination of a flexible substrate that includes preliminarily applied conductive and other suitable layers and a multilayer nanostructured film formed on the surface of the top conductive layer.

In the context of the present invention, the term "multilayer nanostructured film" (hereinafter referred to merely as a "nanostructured film") means a film that comprises a sequence of nanoparticle layers arranged in order of size and type of material.

For better understanding of the principle of the invention, it would be advantageous first to give some simplified theoretical explanation of the FP process.

The method for depositing a multilayer nanostructured film onto a flexible substrate by means of the apparatus of the invention is based on the motion of a nanoparticle through a gaseous medium (i.e., the FP process as defined above). The physical model of the FP process on which the apparatus of the invention is based will now be described in more detail.

According to Newton's and Stokes' laws, the motion equation for a small spherical particle in a continuous viscous medium is written as follows:

$$m \cdot dV/dt = -6\pi \cdot \mu \cdot r \cdot V/Cp \qquad (1)$$

where m is nanoparticle mass, μ is gas dynamic viscosity, r is nanoparticle radius, V is instantaneous velocity of FP, Cp is the slip factor, the numerical value of which may be different from "1" for a very small nanoparticle (see *Aerosol Technology: Properties, Behavior, and Measurement of Airborne Particles* by W. C. Hinds, John Wiley & Sons, 1999, pp. 48 to 50). Noting that $m = \rho \cdot 4/3 \cdot \pi \cdot r^3$ where ρ is the density of the material from which the nanoparticle is made (defined by the type of material), the following equation results from equation 1:

$$dV/dt = -K/(\rho \cdot r^2) \qquad (2)$$

where K is the composite factor that reflects specific features of FP motion through the viscous medium, such as gas pressure, dynamic viscosity, etc.

Equation 2 above shows that for each specific value of the factor K, the values of V and dV/dt (which is FP acceleration) strongly depend on both nanoparticle size (radius, r) and density, ρ. In turn, the time it takes for a given FP to reach the target positioned at a given distance from the starting point (hereafter referred to as "time-to-target") depends on nanoparticle radius and density, thus providing consecutive deposition of nanoparticle layers in order of size and/or type of material.

Equation 2 above can be easily solved, and the resulting plots are shown and described below (see FIGS. 6A to 6D). It should be noted that according to one embodiment of the present invention, the electric field can be applied to the space through which FPs fly. In this case, motion equations 1 and 2 can be slightly modified to include potential impact from the electric field without significantly changing the dependence of FP motion parameters on size and density.

According to one aspect of the present invention, the FP process described above is realized in the apparatus shown in FIGS. 1 to 4 in both static and dynamic (process) modes, where FIG. 1 is a schematic elevation sectional view of the apparatus for realization of the method of the invention, the components being shown in static; FIG. 2, similar to FIG. 1, shows the apparatus in action; FIG. 3 shows the details of the essential parts of the apparatus in FIGS. 1 and 2 on a larger scale; and FIG. 4 is a top view of the apparatus shown in FIG. 2, with some details omitted for simplicity of explanation.

It is understood that the view of FIG. 1 is a general schematic of the apparatus 100 for realization of the method of the invention. The apparatus 100 shown in this drawing comprises a sealable chamber 200 that has interior 229 and a cylindrical inner wall 220 and is filled with a gaseous medium (e.g., nitrogen) maintained at a required pressure that, depending on specific operational conditions, may vary in the range of 0.1 to 100 mTorr. Reference numeral 225 designates the cover of the chamber 200 with an optical window 410 for an energy source, as mentioned below.

A flexible substrate 221 that is removably placed onto the cylindrical inner wall 220 of the chamber consists, e.g., of an insulating layer, such as a vinyl layer 222, which is precoated with a proper conductive coating 223 that comprises, e.g., a conductive film, such as a metal film 224 made, e.g., of Al, Cr, Ti or the alloys thereof, and a carrier-blocking layer, e.g., a hole-blocking layer 226 on top of a metal film 224. After placement onto the inner wall 220 of the chamber 200, the flexible substrate is turned into a cylindrical body.

It should be noted that in accordance with another aspect of the invention, the layers used for precoating the vinyl layer 222 may comprise a conductive polymer film (not shown) in a soft, semiliquid state.

The chamber 200 contains in its interior a rotating body, hereinafter referred to as a "crucible 300" which is rotationally supported by a shaft 310 driven by an electric motor 314 to rotate the rotating body. In addition to the rotary motion, the crucible can perform linear motion in the vertical direction, shown by arrow 312. For this purpose, the apparatus 100 is provided with a linear stepper motor 315, and a guide key 311 is provided on the shaft 310 for guiding the crucible along the shaft.

As shown in FIG. 1, the cylindrical body of the flexible substrate 221 has a longitudinal axis Z-Z and surrounds the crucible 300 so that a space 299 is provided between the crucible and the flexible substrate.

On its upper side, the crucible has a recess 306 intended for receiving a liquid medium that contains nanoparticles separable from the liquid medium by evaporating the liquid medium. For example, this can be a nanoparticle-containing solution 302 that is supplied to the recess 306 from the source of the liquid medium by means for delivery of the liquid medium from a container 307 to the surface of the crucible 300. The delivery system contains a mass-flow controller 308 and a flexible tube 320 that passes through the wall 220 of the chamber and terminates near and above the center of the crucible 300.

The nanoparticle-containing solution may contain nanoparticles, the materials for which are selected from the group of materials belonging to groups IV, II-VI, and III-V of elements, metals, and metal oxides, said nanoparticles having sizes ranging from 2 nm to 10 nm. Examples of these materials are the following: Si, Ge, CdTe, CdSe, CdS, InP, TiOx, InAs, PbS, PbSe, HgTe, $CuInSe_2$, $CuInGaSe_2$, etc.

The outlet end of the flexible tube 320 is maintained at a constant and predetermined distance from the surface of the recess 306 by means of a tube holder 330 that rests on the upper surface of the recess and is supported by frictionless members, such as balls. Thus, change in the vertical position of the crucible with respect to the wall 220 that holds the opposite end of the flexible tube is compensated by compensation loops of the flexible tube 320. Point contact of the holder with the crucible surface does not present an obstacle for movement of the nanoparticle-containing solution in the radial outward direction. Preferably, the upper side of the crucible recess 306 is smooth, e.g., polished for imparting to it antifriction properties, and has a surface 301 flattened toward the edges of the rotating body.

An essential component of the apparatus of FIG. 1 is the source of high radiant energy, hereinafter referred to as a power laser 400 which is capable of interacting with the nanoparticle-containing solution 302 located in the crucible 300 by irradiating a predetermined part of the crucible surface, i.e., a substantially flat peripheral surface 301 on which the solution forms a thin, easily vaporizable layer. For this purpose, the laser should have power sufficient to evaporate the liquid medium when the liquid is irradiated by a laser beam. Furthermore, the power laser 400 should be capable of generating an annular-shaped beam (not shown in FIG. 1) for creating an annular light spot on the aforementioned flat peripheral surface 301. Such power lasers are known in the art, and the power laser 400 can be operated, e.g., on the principle of the power laser source described in U.S. Pat. No. 7,585,751 issued in 2009 to Naotoshi Kirihara and others.

Since during operation the crucible is moving in the longitudinal direction, the apparatus 100 is provided with means for moving the laser 400 in synchronism with the crucible. In the illustrated example, these means comprise a linear motor, e.g., a stepper linear motor 420, connected to the laser 400 and guides 421 for guiding the laser 400 in the vertical direction.

The stepper motors 315 and 420, the rotor motor 314, and the mass-flow controller 308 are connected to a control unit, such as a central processing unit (CPU), which controls operation of the mechanisms and synchronizes their motions.

In FIG. 1, reference numeral 423 designates the source of inert gas, e.g., nitrogen, 425 designates a nitrogen gas pump for the supply of gaseous nitrogen to the chamber through a pipe 431 and by means of a pressure-controlling valve 427 installed in the pipe 431, and reference numeral 429 designates a pump-motor driver through which the pump motor is connected to the CPU.

Not shown are auxiliary components of the apparatus required for the process, such as a gas-pressure control, colloidal solution preparation equipment, etc.

FIG. 2 is a partial view of the apparatus of FIG. 1 that shows the apparatus in action, some details of the apparatus being not shown. According to one or several aspects of the invention, under command from the CPU, the process begins with raising the crucible 300 in the direction of the arrow 312 to the vertical position in which the upper surface 301 of the crucible is aligned with the position on the flexible substrate 221 from which deposition begins. By command from the CPU to the driver 429, the pump 425 activates and begins to supply gaseous nitrogen to the chamber 200 through the pipe 431 by means of the valve 427.

By command from the CPU, the stepper motor 420 activates and moves the laser 400 in the guides 421 to a position in which the beam generated by the laser is focused onto the aforementioned flat peripheral surface 301 of the crucible 300. The supply of the nanoparticle-containing solution 302 begins and proceeds to the recess 306 of the crucible 300 from the container 307 by means of the mass-flow controller 308 and through the flexible tube 320.

The CPU also sends a command to start the motor 314, the crucible 300 is brought into rotation by means of the shaft 310 with such frequency of rotation that causes movement of the nanoparticle-containing solution 302 under the effect of the centrifugal force in the radial outward direction along the curved surface of the recess 306 to the flat peripheral surface 301 of the crucible 300. As a result, as shown in FIG. 2, a layer 303 of the nanoparticle-containing solution is formed on the surface 301. At this moment, the power laser 400 is activated, and an annular laser beam 405 is directed through the optical window 410 of the cover 225 (FIGS. 1 and 2) onto the aforementioned flat peripheral surface 301 on which the beam is focused.

Under the effect of the laser beam 405, a liquid component of the solution 302 evaporates instantaneously (i.e., in a very short time as compared to the FP time-to-target), which is conventionally shown by arrows 304 in FIGS. 2 and 3, which is a fragmental view of the crucible shown in operation on a larger scale (for simplicity, the tube holder 330 is not shown in the drawings). As a result, only the nanoparticles, which are solid and are designated by reference numerals 500, 510, 520, etc., remain and fly out from the edge of the circular crucible in the tangential direction. This is shown in FIG. 3 by arrow 305, while tangentiality of nanoparticle flow (arrow 309) and flying distance L of a particle FP from the edge of the crucible 300 to the surface of the flexible substrate 221 are shown in FIG. 4. From the moment the nanoparticles leave the crucible, they are turned into flying particles, i.e., FP, as defined earlier.

It can be assumed that since the molecules of the solution layer 303 evaporate in the upward direction, as schematically shown by arrows 304 in FIG. 3, they will not create a noticeable resistance to the horizontal tangential movement of the nanoparticles 500, 510, etc., that fly out from the rotating crucible 300. Reference numeral 600 designates the multilayer nanostructured film deposited onto layer 226 of the flexible substrate 221 (FIG. 1).

In FIG. 4, reference numeral 710 designates a slit that is formed between the edges of the rectangular flexible substrate 221 when the latter is formed into a cylinder and is inserted into the space formed by the inner walls 220 of the chamber 200.

As has been described above at the beginning of the Detailed Description, instantaneous velocity V of each FP and FP acceleration dV/dt strongly depend on both nanoparticle size (radius, r) and density, ρ. In turn, the time it takes for a given FP to reach the target positioned at a given distance from the starting point (time-to-target) depends on nanoparticle radius and density, thus providing consecutive deposition of nanoparticle layers in the order of their size and/or type of material. In other words, nanoparticles that form the multilayer nanostructured film are sorted by their dimensions and or/densities in the thickness direction of the film. Such a structure is shown in FIG. 5, which is a cross section through multilayer nanostructured film 600 in the film thickness direction. Here, reference numeral 221 designates the flexible substrate. A first layer 610, which is nearest the substrate 221, is formed from the largest nanoparticles of those present in the solution 302. The next layer 620, which deposited on the layer 610, is formed from particles that are smaller in size, and so on. The uppermost layer 650 of the obtained multilayer nanostructured film 600 is formed from the smallest nanoparticles of the nanoparticle-containing solution. As a result, an item 602 of the flexible nanostructured material is obtained and comprises the flexible substrate 221 with the multilayer nanostructured film 600. Some of the aforementioned layers, e.g., the layer 615, may consist of nanoparticles made from material different from that of other layers. In FIG. 4 this is shown by different colors of the particles that form the layer 615.

It is understood that in reality there will be no strict boundaries between the layers of nanoparticles of different sizes and that the layers will be slightly intermixed, but the general trend will correspond to that described above and will provide a desirable gradient of nanoparticle size required for improving efficiency of PV conversion, which makes the multilayer nanostructured film of the invention suitable for efficient use in the manufacture of solar panels and in various optoelectronic devices. It is also understood that the spherical nanoparticles will not be ideally packed in the multiplayer structure 600 formed on the surface of the flexible substrate 221, but from the practical point of view the structure of the nanoparticle layers shown in FIG. 5 will be sufficient for providing an essential improvement in the PV-conversion efficiency.

It is also understood that nanoparticles that simultaneously leave the edge of the rotating crucible 300 will form a band of a certain width. Therefore, the speed "v" of the vertical movement of the crucible in the direction of arrow 312 (FIG. 2) should be coordinated with the width of the aforementioned band and with the time-to-target defined above.

Additionally, as shown in FIG. 1, in order to enhance attraction of nanoparticles to the substrate surface and to prevent FP recoil from this surface, an electric voltage source 350 may be electrically connected between the conductive (metal) layer 224 and the crucible 300. The purpose of the source 350 is to produce an electric field in the space intersected by FPs on their way to the substrate so that on FP arrival at the surface of the flexible substrate 221, an attractive electric force is applied to the particles.

Figure 6A:
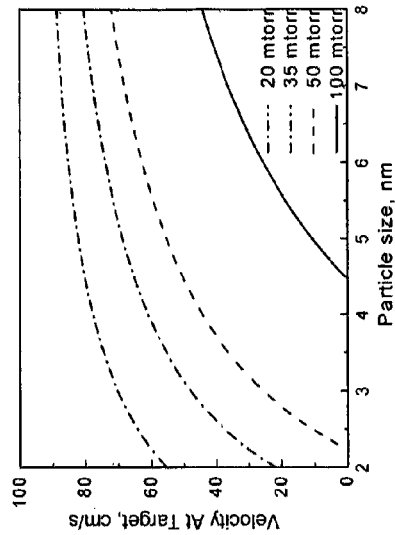
FIG. 6A is a graph that shows effects of nanoparticle size on the time-to-target for various gas pressures in the chamber, the distance to target being equal to 2 cm.
Figure 6B:
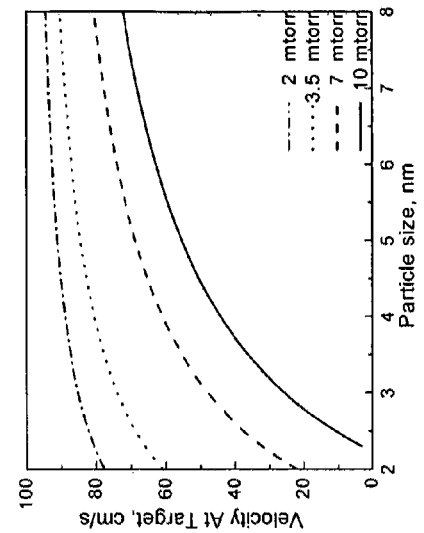
FIG. 6B is graph that shows effects of nanoparticle size on velocity at the target for various gas pressures in the chamber, the distance to target being equal to 2 cm.
Figure 6C:
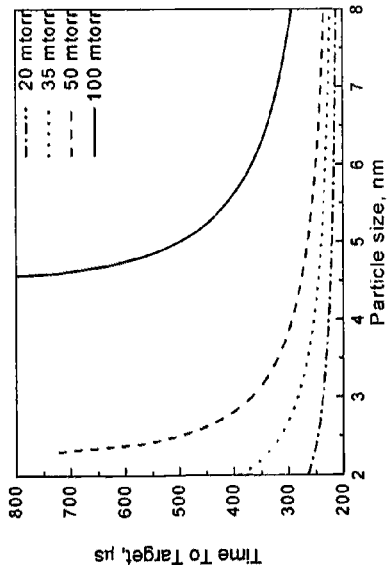
FIG. 6C is a graph that shows effects of nanoparticle size on time-to-target for various gas pressures in the chamber, the distance to target being equal to 10 cm.
Figure 6D:
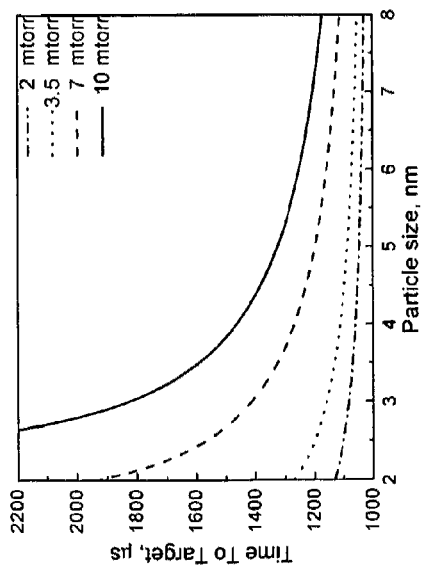
FIG. 6D is graph that shows effects of nanoparticle size on the velocity at the target for various gas pressures in the chamber, the distance to target being equal to 10 cm.

FIGS. 6A through 6D show that the time-to-target and FP velocity at the target depend on the size of the nanoparticles. In particular, FIG. 6A is a graph that shows effects of nanoparticle size on the time-to-target for various gas pressures in the chamber, the distance to target being equal to 2 cm. FIG. 6B shows the effects of nanoparticle size on the velocity at target (arrival velocity) for various gas pressures in the chamber, the distance to target being equal to 2 cm. FIG. 6C is a graph that shows the effects of nanoparticle size on time-to-target for various gas pressures in the chamber, the distance to target being equal to 10 cm. FIG. 6D is a graph that shows the effects of nanoparticle size on the velocity at target for various gas pressures in the chamber, the distance to target being equal to 10 cm. All four drawings are shown for the specific materials of nanoparticles such as InAs or HgTe. Depending on the working gas pressure in the chamber, the respective curves are shown by solid lines, broken lines, dotted lines, or dash-and-dot lines.

Upon completion of FP process, the chamber 200 is depressurized, the cover 225 is opened, and an item 700 of the flexible nanostructured material 602 is removed from the apparatus.

Figure 7:
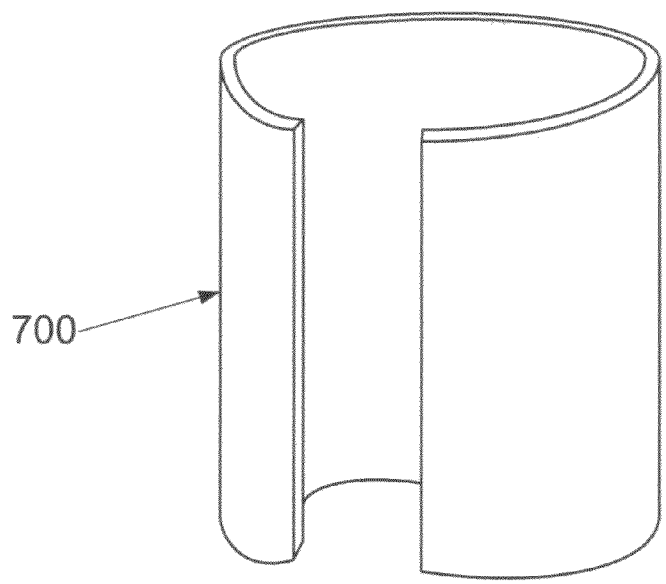
FIG. 7 is a view that shows a fragment of the flexible nanostructured item of the invention removed from the apparatus after nanoparticles are deposited onto the substrate.

FIG. 7 shows item 700 removed from the apparatus after nanoparticles are deposited onto the substrate. It is understood that the item 700 is unfolded into a flat plate-like piece (not shown) before solar panel assembly.

Figure 8:
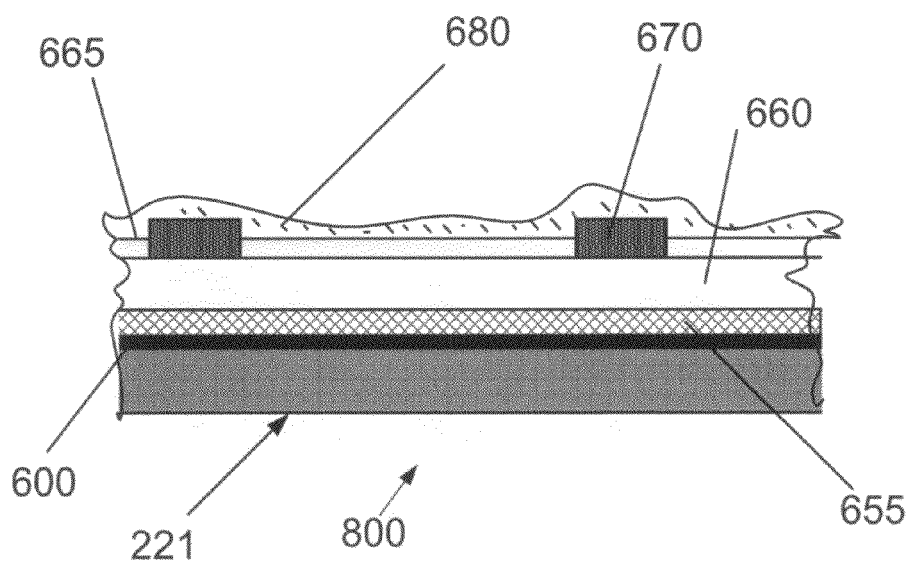
FIG. 8 is a cross-sectional view of a solar panel based on use of the flexible nanostructured item of the invention.

FIG. 8 is a cross-sectional view of a solar panel 800 based on the use of the flexible nanostructured item 700 of the invention. The solar panel 800 is manufactured as follows. In the example shown in FIG. 8, a hole-conductive/electron-blocking layer 655 (e.g., a TPD layer) is deposited on top of the multilayer nanostructured film 600, e.g., by spin casting. Optionally, an n-type layer (not shown) made, e.g., of amorphous silicon or conductive polymer, is applied onto the layer 655. The next layer 660, which is an indispensable transparent conductive oxide (TCO) made, e.g. of indium tin oxide (ITO), is placed onto the aforementioned n-type layer or directly onto the layer 660. The subsequent layers, which are inherent to any solar panel, may comprise metal electrodes (only one of which, i.e., the metal electrode 670, is designated in the drawing), an antireflective coating 665, and a protective layer 680.

The use of the apparatus of the present invention can be illustrated by the following application example.

Apparatus Design Parameters:
1. Inner radius cylindrical chamber (of wall 220 of FIG. 1): 14 cm;
2. Radius of crucible 300: 10 cm;
3. Vertical length of chamber: 1.0 m;
4. Distance to target: 10 cm;
5. Flexible substrate dimensions: 0.9×0.9 m$^2$ Process Parameters:
1. Rotational frequency of crucible during FP deposition: 9600 rpm (providing initial FP velocity is 100 m/s);
2. Pressure of gas (nitrogen) in chamber: 3 to 7 mTorr;
3. Pulse energy of laser 400: 0.01 to 0.1 J/cm$^2$;
4. Laser pulse duration: 10 to 100 ns;
5. Pulse frequency during process: e.g., 500 Hz;
6. Vertical speed of crucible 300: 0.5 to 1.0 cm/s.

The nanoparticle material is InAs or HgTe. The nanoparticle-containing solution 302 is prepared according to a colloidal-solution-processing technique described, e.g., in "Efficient solution-processed infrared photovoltaic cells," *Applied Physics Letters*, 90,183113. The nanoparticle mix in the solution consists of nanoparticles having radii of 2, 3, 4, 5, and 6 nm, with concentration in the range of $5\times10^{11}$-$2\times10^{13}$ cm$^{-3}$ (smaller particles have a higher concentration than larger particles). It is assumed that while the nanoparticles are in a solution, they are present in the form of quantum dots with attached organic ligands; these ligands either disappear during the evaporation cycle or remain with an FP during flight and deposition on the flexible substrate. Time-to-target for all FPs will range from 1.2 to 2.0 ms.

The nanostructured film 600 (FIGS. 2, 4, and 5) is formed when nanoparticles with the above-described parameters are deposited onto the flexible substrate 221 (FIG. 1) in the apparatus of the above-described application example and under conditions of the process described. This multilayer nanostructured film comprises a sequential nanoparticle layer structure with the thickness of each nanoparticle layer ranging from 8 to 15 nm. The size of the nanoparticles in an individual layer varies from 6 nm in the first deposited layer 610 to 2 nm in the uppermost layer 650 (FIG. 5).

Calculations made by a person skilled in the art show that power-conversion efficiency (PCE) will range from 20 to 25% or higher for a solar panel that is designed according to the model shown in FIG. 8 and produced according to the method of the invention under the above-described conditions. In reality, the PCE value will critically depend on many factors, some of which may not be mentioned in the present specification. In general, such a parameter as an estimated efficiency-to-cost ratio is to be approximately 0.1$/W or less.

Although the invention has been shown and described with reference to specific embodiments, it is understood that these embodiments should not be construed as limiting the areas of application of the invention and that any changes and modifications are possible provided that these changes and modifications do not depart from the scope of the attached patent claims. For example, vertical motion of the crucible can start at the lowest position and proceed in the upward direction. The laser that produces an annular spot can be replaced by a regular IR-laser in combination with beam-deflecting and beam-guiding optics. The solution-evaporation area is not necessarily limited by the peripheral portion of the crucible, and, if necessary, a larger part of the solution surface can be irradiated by the laser beam. The structure of the flexible substrate is not limited by the example described and illustrated in the present specification and may include additional layers for more efficient electron collection and transport that follows photovoltaic conversion in the PV-active multilayer nanostructured film.

The invention claimed is:

1. An apparatus for forming a flexible nanostructured material for photovoltaic panels comprising:
   a sealable chamber having an interior and a cylindrical inner wall; a source of inert gas connected to the interior of the sealable chamber for filling the interior of the sealable chamber with inert gas under pressure;
   a flexible substrate for photovoltaic panels precoated with a conductive coating, said substrate being removably placed onto the cylindrical inner wall of the sealable chamber;
   a rotating body rotationally installed in the interior of the sealable chamber, said rotating body having a surface, and a space being provided between the rotating body and the flexible substrate;
   a source of a liquid medium that contains nanoparticles separable from the liquid medium by evaporating said liquid medium, said source of liquid medium being connected to the interior of the sealable chamber;
   means for delivery of the liquid medium from the source of the liquid medium to said surface of the rotating body;
   a source of high radiant energy for irradiating the liquid medium on said surface, said source of high radiant energy having power sufficient to evaporate the liquid medium when the liquid medium is irradiated with said source of high radiant energy;
   means for rotating the rotating body; and
   a control unit configured to control the supply of the liquid medium onto said surface of the rotating body through said means for delivery of the liquid medium simultaneously with irradiation of said liquid medium on the surface of the rotating body by means of the source of high radiant energy so that simultaneously with evaporation of the liquid medium the nanoparticles are released by centrifugal force from the liquid medium and fly away from said surface to the flexible substrate precoated with a conductive coating for depositing onto this conductive coating.

2. The apparatus of claim 1, wherein the control unit comprises means for focusing the beam generated by the source of high radiant energy on the surface of the liquid medium.

3. The apparatus of claim 2, wherein means for focusing the beam on the surface of the liquid medium comprise a first linear motor for moving the source of high radiant energy, a second linear motor for moving the rotating body, and the control unit connected to the first linear motor and the second linear motor.

4. The apparatus of claim 1, wherein the rotating body has a recess in the center of said surface, said surface being flattened toward the edges of the rotating body.

5. The apparatus of claim 1, wherein the source of high radiant energy comprises a power laser.

6. The apparatus of claim 5, wherein the power laser is a power laser that generates an annular beam focused on the surface of the liquid medium.

7. The apparatus of claim 1, wherein the liquid medium is a colloidal solution that contains nanoparticles selected from nanoparticles of different sizes and types of materials.

8. The apparatus of claim 7, wherein the control unit comprises means for focusing the beam generated by the source of high radiant energy on the surface of the liquid medium.

9. The apparatus of claim 8, wherein means for focusing the beam on the surface of the liquid medium comprise a first linear motor for moving the source of high radiant energy, a second linear motor for moving the rotating body, and the control unit connected to the first linear motor and the second linear motor.

10. The apparatus of claim 1, wherein the rotating body has a recess in the center of said surface, said surface being flattened toward the edges of the rotating body and wherein the source of high radiant energy comprises a power laser that is controlled from the control unit and is capable of generating an annular beam that can be focused on the surface of the liquid medium.

11. The apparatus of claim 10 that further comprises means for delivery of the liquid medium from the source of the liquid medium to said surface of the rotating body, said means for delivery of the liquid medium comprising a flexible tube that passes through the cylindrical inner wall of the sealable chamber and has a first end connected to the source of liquid medium and a second end located above the liquid in said recess in the center of said surface.

12. The apparatus of claim 11, wherein the liquid medium is a colloidal solution that contains nanoparticles selected from nanoparticles of different sizes and types of material.

13. The apparatus of claim 1, wherein the flexible substrate is precoated with a metal conductive film with a carrier-blocking layer on the top of said metal-conductive layer.

14. The apparatus of claim 13, wherein the rotating body has a recess in the center of said surface, said surface being flattened toward the edges of the rotating body and wherein the source of high radiant energy comprises a power laser that is controlled from the control unit and is capable of generating an annular beam that can be focused on the surface of the liquid medium.

15. The apparatus of claim 14, further comprising means for focusing the beam of the power laser on the surface of the liquid medium, said means for focusing the beam of the power laser on the surface of the liquid medium comprise a first linear motor for moving the source of high radiant energy, a second linear motor for moving the rotating body, and the control unit connected to the first linear motor and the second linear motor.

16. The apparatus of claim 1, further comprising an electric voltage source that is electrically connected between the conductive coating and the rotating body for generating an electric field in the space between the rotating body and the flexible substrate in order to apply an attractive electric force to the nanoparticles on their way to the substrate.

17. The apparatus of claim 3, further comprising an electric voltage source that is electrically connected between the conductive coating and the rotating body for generating an electric field in the space between the rotating body and the flexible substrate in order to apply an attractive electric force to the nanoparticles on their way to the substrate.

18. The apparatus of claim 10, further comprising an electric voltage source that is electrically connected between the conductive coating and the rotating body for generating an electric field in the space between the rotating body and the flexible substrate in order to apply an attractive electric force to the nanoparticles on their way to the substrate.

\* \* \* \* \*